(12) United States Patent
Kamineni et al.

(10) Patent No.: US 10,593,593 B2
(45) Date of Patent: Mar. 17, 2020

(54) METHODS, APPARATUS, AND SYSTEM FOR PROTECTING COBALT FORMATIONS FROM OXIDATION DURING SEMICONDUCTOR DEVICE FORMATION

(71) Applicant: GLOBALFOUNDRIES INC., Grand Cayman (KY)

(72) Inventors: Vimal Kamineni, Albany, NY (US); Ruilong Xie, Niskayuna, NY (US); Mark Raymond, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/047,470

(22) Filed: Jul. 27, 2018

(65) Prior Publication Data
US 2020/0035556 A1  Jan. 30, 2020

(51) Int. Cl.
| | | |
|---|---|---|
| *H01L 21/768* | (2006.01) |
| *H01L 21/285* | (2006.01) |
| *H01L 21/82* | (2006.01) |
| *H01L 29/417* | (2006.01) |
| *H01L 21/8238* | (2006.01) |
| *H01L 29/78* | (2006.01) |
| *H01L 29/66* | (2006.01) |

(52) U.S. Cl.
CPC .. *H01L 21/76897* (2013.01); *H01L 21/28506* (2013.01); *H01L 21/823821* (2013.01); *H01L 29/41791* (2013.01); *H01L 29/66795* (2013.01); *H01L 29/785* (2013.01)

(58) Field of Classification Search
CPC ....... H01L 21/76897; H01L 21/823821; H01L 29/41791; H01L 29/785; H01L 29/66795; H01L 21/28506
USPC ........................................................ 257/365
See application file for complete search history.

(56) References Cited

U.S. PATENT DOCUMENTS

2007/0267461 A1* 11/2007 Yu ..................... H01L 21/67017
                                                                228/101
2014/0077305 A1    2/2014 Pethe et al.
2016/0336183 A1* 11/2016 Yuan ................. H01L 29/66795
2017/0317076 A1* 11/2017 Shen ................ H01L 21/823475

* cited by examiner

*Primary Examiner* — Caleen O Sullivan
(74) *Attorney, Agent, or Firm* — Williams Morgan, P.C.

(57) ABSTRACT

Methods comprising forming a cobalt formation on an active feature of a semiconductor device, wherein the semiconductor device comprises an inactive feature above the cobalt formation; forming a cap on the cobalt formation; removing at least a portion of the inactive feature, wherein the cobalt formation is substantially not removed; forming a dielectric material above the cap; and forming a first contact to the cobalt formation. Systems configured to implement the methods. Semiconductor devices produced by the methods.

13 Claims, 8 Drawing Sheets

METHODS, APPARATUS, AND SYSTEM FOR PROTECTING COBALT FORMATIONS FROM OXIDATION DURING SEMICONDUCTOR DEVICE FORMATION

BACKGROUND OF THE INVENTION

Field of the Invention

Generally, the present disclosure relates to the manufacture of sophisticated semiconductor devices, and, more specifically, to various methods and systems for protecting cobalt formations from oxidation during semiconductor device formation.

Description of the Related Art

The technology explosion in the manufacturing industry has resulted in many new and innovative manufacturing processes. Today's manufacturing processes, particularly semiconductor manufacturing processes, call for a large number of significant steps. These process steps usually require a number of inputs that are generally fine-tuned to maintain proper manufacturing control.

The manufacture of semiconductor devices requires a number of discrete process steps to create a packaged semiconductor device from raw semiconductor material. Generally, a set of processing steps is performed on a group of semiconductor wafers, sometimes referred to as a lot, using semiconductor-manufacturing tools, such as an exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, aluminum, may be formed that serve as conductive lines that connect one region on the semiconductor wafer to another. In this manner, integrated circuit chips may be fabricated.

To provide electrical conductivity between elements of a FinFET semiconductor device in which the channel of the FET is in a fin disposed on a substrate, the sources and drains of the FET are disposed in, or on one or more fins, and the gate of the FET is disposed over one or more fins, cobalt formations have a number of desirable properties in forming contacts from the sources and drains to conductive elements in higher levels of the semiconductor device. Unfortunately, cobalt is relatively susceptible to oxidation. A number of processes commonly used in semiconductor device formation, such as reactive ion etch (ME) to remove spacers, and deposition of dielectric materials such as silicon oxide and SiOC, involve the exposure of the semiconductor device to oxygen. Oxidized cobalt is less electrically conductive than reduced cobalt, and accordingly, cobalt oxidation is undesirable.

To minimize cobalt oxidation, workers have prepared FinFET devices wherein gate contacts are formed at a distance from sources and drains, typically over a shallow trench isolation (STI) between fins. The sources and drains are formed to not cross over the STI between fins. Though functional, allowing gate contact formation solely over STI regions limits design options, and forbidding sources and drains from crossing over STI regions limits wiring options.

Other workers in the field have alleged that silicon carbide (SiC) caps on cobalt formations inhibit cobalt oxidation. However, the present workers have noted a number of undesirable properties of SiC, such as its tendency to silicide the surface of cobalt formations. This can cause higher resistance, which is undesirable.

The present disclosure may address and/or at least reduce one or more of the problems identified above.

SUMMARY OF THE INVENTION

The following presents a simplified summary of the disclosure in order to provide a basic understanding of some aspects of the disclosure. This summary is not an exhaustive overview of the disclosure. It is not intended to identify key or critical elements of the disclosure or to delineate the scope of the disclosure. Its sole purpose is to present some concepts in a simplified form as a prelude to the more detailed description that is discussed later.

Generally, the present disclosure is directed to a method, comprising forming a cobalt formation on an active feature of a semiconductor device, wherein the semiconductor device comprises an inactive feature above the cobalt formation; forming a cap on the cobalt formation; removing at least a portion of the inactive feature, wherein the cobalt formation is substantially not removed; forming a dielectric material above the cap; and forming a first contact to the cobalt formation.

The present disclosure is also directed to a semiconductor device, comprising a plurality of active features; a cobalt formation disposed on at least two of the active features; a cap on the cobalt formation; a dielectric material on the cap on the cobalt formation on at least one active feature; and a first contact on the cap on the cobalt formation on at least one other active feature.

The present disclosure also includes a semiconductor device manufacturing system adapted to implement one or more steps of the method.

The present disclosure may reduce oxidation of cobalt formations in semiconductor devices without the need for SiC caps.

BRIEF DESCRIPTION OF THE DRAWINGS

The disclosure may be understood by reference to the following description taken in conjunction with the accompanying drawings, in which like reference numerals identify like elements, and in which.

Figure 1:
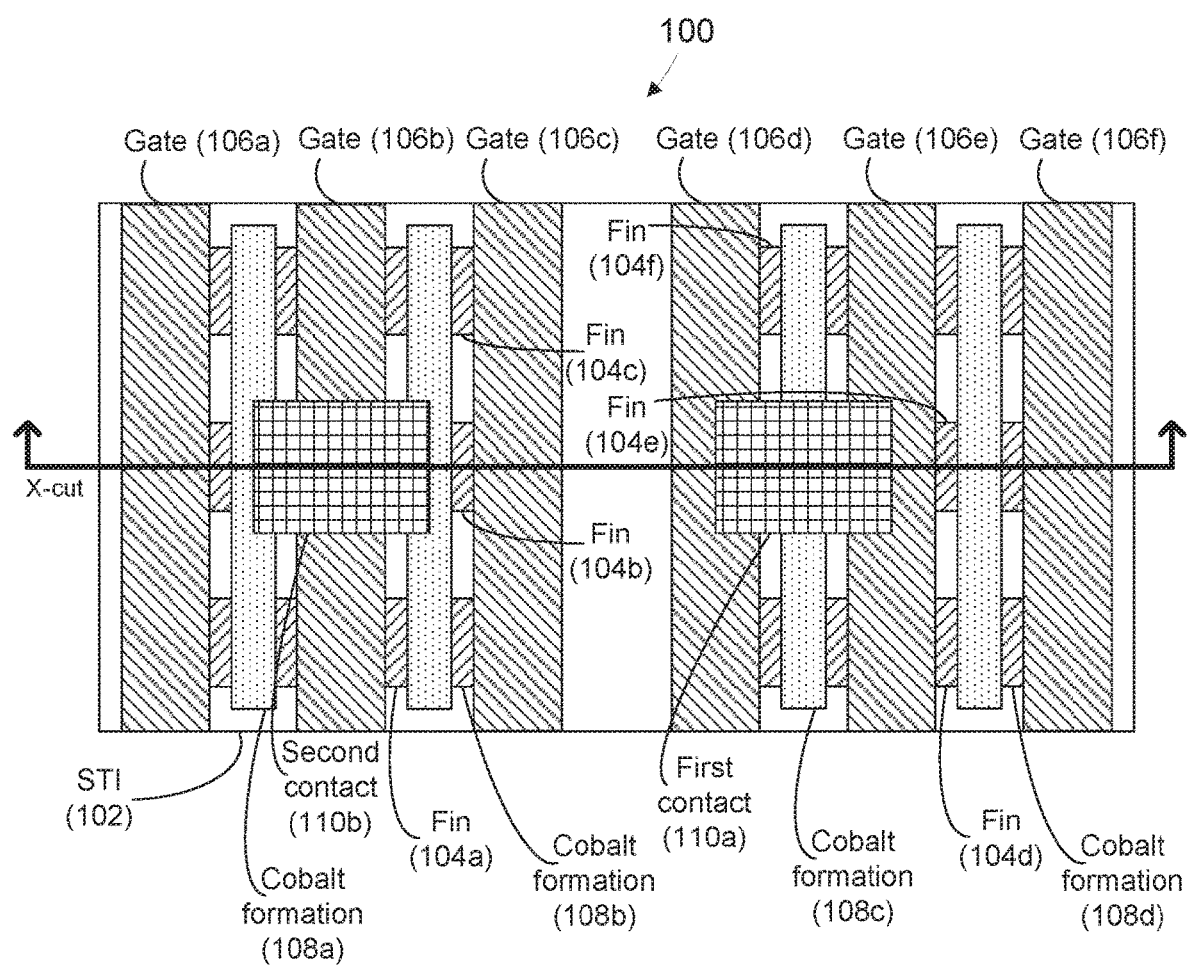
FIG. 1 illustrates a stylized top view of a semiconductor device, in which an X-cut cross-section depicted in subsequent figures is indicated, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

DETAILED DESCRIPTION

Various illustrative embodiments of the disclosure are described below. In the interest of clarity, not all features of an actual implementation are described in this specification. It will, of course be appreciated that, in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would be a routine undertaking for those of ordinary skill in the art having the benefit of this disclosure.

The present subject matter will now be described with reference to the attached figures. Various structures, systems and devices are schematically depicted in the drawings for purposes of explanation only and to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein are directed to semiconductor devices comprising cobalt formations that are protected from oxidation, and methods and systems for forming such devices.

Figure 10:
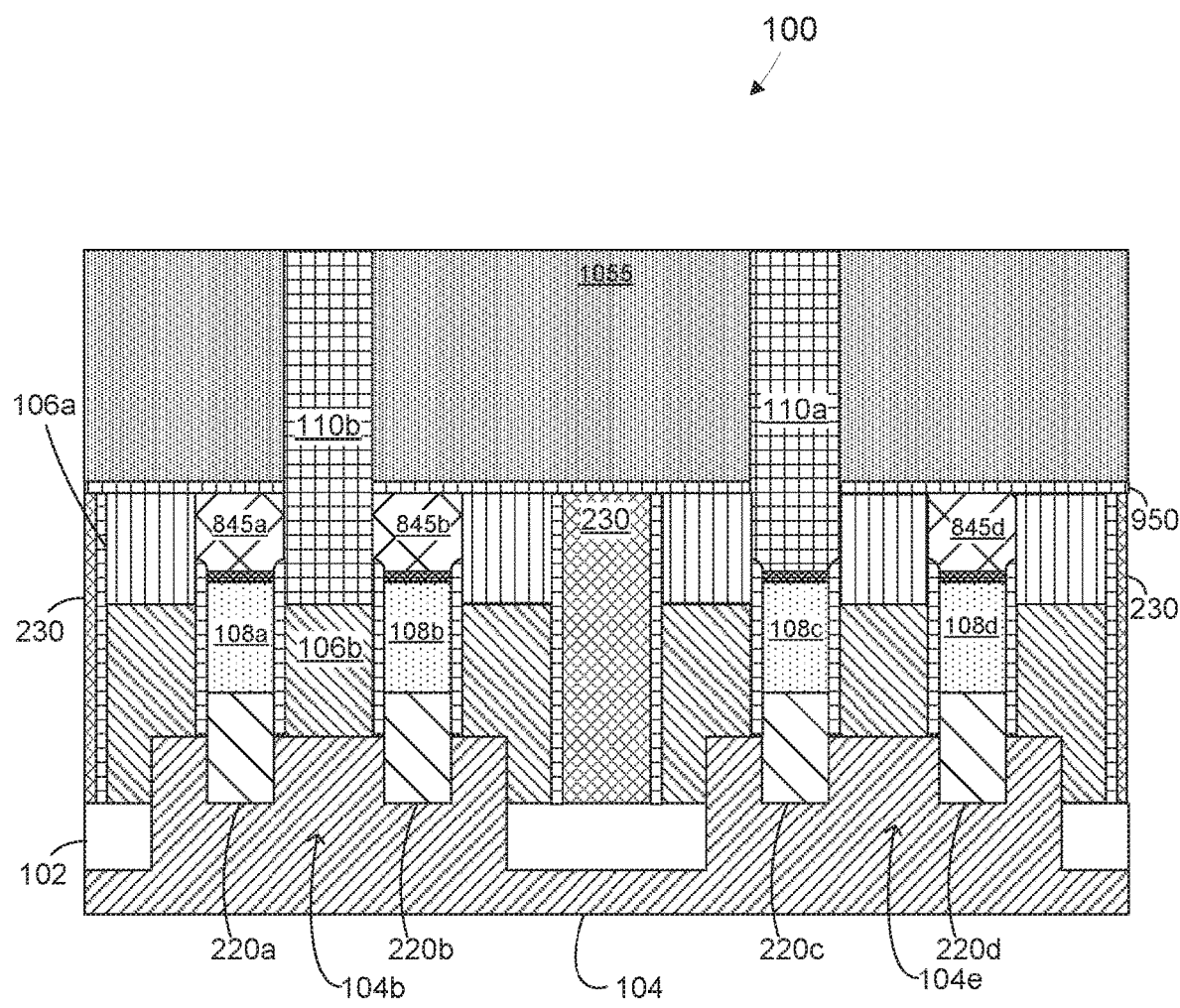
FIG. 10 illustrates a stylized X-cut cross-sectional depiction of a semiconductor device after a ninth stage of processing in accordance with embodiments herein.

Turning to FIG. 1, a simplified top or plan view of a semiconductor structure, generally denoted by 100, obtained during a stage of semiconductor fabrication shown in FIG. 10 and described in more detail below, is depicted. (For ease of illustration of particular features, a number of structures shown in FIG. 10 are omitted from FIG. 1).

The semiconductor structure 100 comprises a plurality of fins 104a, 104b, 104c, 104d, 104e and 104f are formed. The fins 104a-f may be formed by etching a semiconductor substrate (not shown in FIG. 1). The fins 104a-f may comprise silicon, silicon-germanium, or other appropriate materials. The fins 104a-f may comprise one or more dopants. Alternatively or in addition, the fins 104a-f may comprise an epitaxial material, such as epitaxial silicon or epitaxial silicon-germanium, on part or all of the top and/or sides of the fins 104a-f. The fins 104a-f may each be used as a channel in a FinFET (field-effect transistor) structure, as is known to the person of ordinary skill in the art.

Each fin 104a-f generally has a long horizontal dimension and a short horizontal dimension perpendicular to the long horizontal dimension. The section from which the view of FIGS. 2-10 is taken is along the long horizontal dimensions of fins 104b and 104e.

FIG. 1 also shows, surrounding the fins 104a-f, a shallow trench isolation (STI) 102. The STI 102 may be formed of any material that electrically isolates each of the fins 104a-f from one another.

FIG. 1 also shows a number of structures disposed on the fins 104a-f. A plurality of gates 106a, 106b, 106c, 106d, 106e, and 106f are disposed on the fins 104a-f. Each of the gates 106a-f may comprise a high-k gate metal or other suitable gate materials known to the person of ordinary skill in the art. Each of the gates 106a-f generally has a long horizontal dimension and a short horizontal dimension perpendicular to the long horizontal dimension. The long horizontal dimension of each gate 106a-f is perpendicular to the long horizontal dimension of each fin 104a-f.

Between gates 106a-f are disposed a plurality of cobalt formations 108a, 108b, 108c, and 108d. Each of the cobalt formations 108a-d comprises cobalt. Though not to be bound by theory, cobalt may provide effective electrical communication between an active feature, e.g., an epitaxial source/drain (not shown in FIG. 1) formed in/on a fin 104a-f and one or more conductive elements to be disposed above the cobalt formations 108a-d. Each of the cobalt formations 108a-d generally has a long horizontal dimension and a short horizontal dimension perpendicular to the long horizontal dimension. The long horizontal dimension of each cobalt formation 108a-d is perpendicular to the long horizontal dimension of each fin 104a-f.

At the stage of fabrication depicted in FIG. 1, the semiconductor structure 100 contains a first contact 110a and a second contact 110b. The first contact 110a is disposed over and in electrical contact with a cobalt formation, e.g., cobalt formation 108c. As will be seen in later figures, the first contact 110a is not in electrical contact with gate 106d or gate 106e. The second contact 110b is disposed over and in electrical contact with a gate, e.g., gate 106b. As will be seen in later figures, the second contact 110b is not in electrical contact with cobalt formation 108a or cobalt formation 108b.

Subsequent stylized cross-sectional depictions of the semiconductor device 100 according to embodiments herein will be taken along the depicted X-cut through and perpendicular to the long axes of gates 106a-f and cobalt formations 108a-d, and through and parallel to the long axes of fins 104b and 104e. One or more of the subsequent cross-sectional views may depict the semiconductor device 100 before the processing stage shown in FIG. 1.

Figure 2:
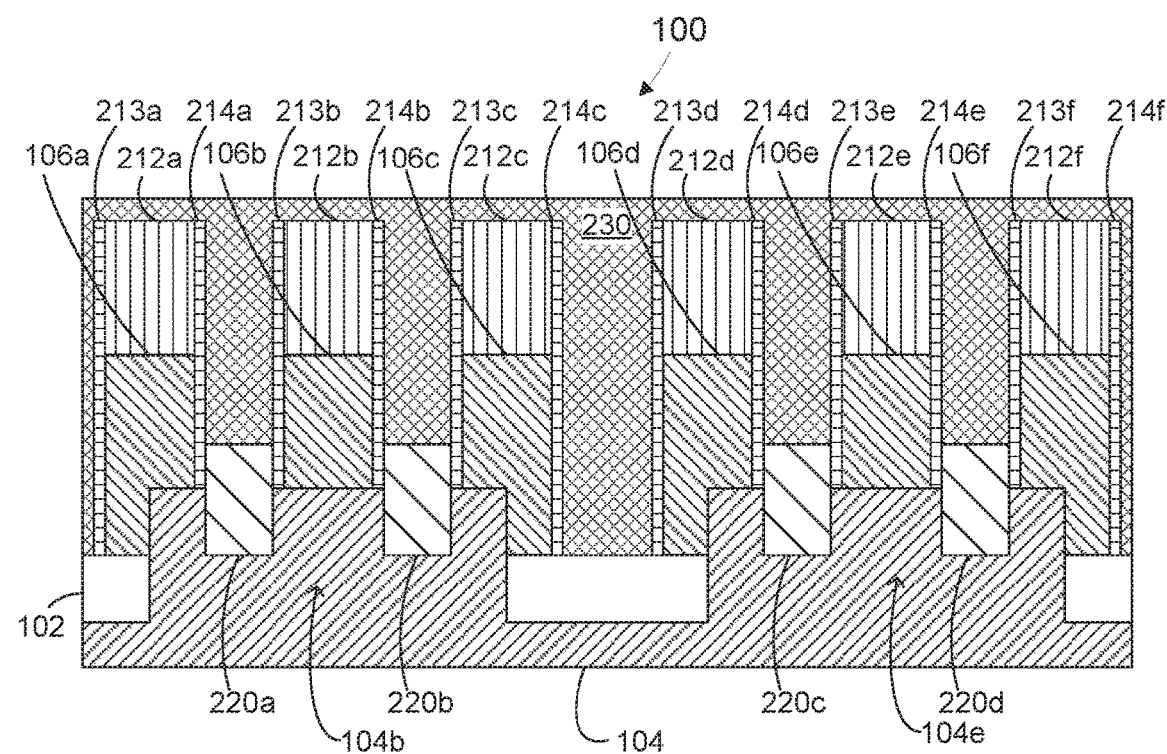
FIG. 2 illustrates a stylized X-cut cross-sectional depiction of a semiconductor device after a first stage of processing in accordance with embodiments herein.

FIG. 2 illustrates a stylized X-cut cross-sectional depiction of a semiconductor device after a first stage of processing in accordance with embodiments herein. The first stage of processing forms a number of features of the semiconductor device 100 shown in FIG. 1.

The fins 104b, 104e (along with the other fins 104a, 104c, 104d, and 104f shown in FIG. 1) may be formed, such as by etching away portions of a semiconductor substrate 104 to yield the fins 104b, 104e above the semiconductor substrate 104. In other embodiments (not shown), the fins 104b, 104e may be formed by depositing and/or epitaxially growing one or more materials on the semiconductor substrate 104. The semiconductor substrate 104 may comprise silicon, silicon-germanium, silicon-on-insulator (SOI), or other materials known in the FinFET arts. The SOI 102 is disposed on the semiconductor substrate 104 and surrounds at least the lower portions of each fin 104b, 104e.

Each gate 106a-106f is disposed on the fins 104b, 104e as described above. Self-aligned caps 212a-212f are disposed on the tops of the gates 106a-106f. In one embodiment, each of the self-aligned caps 212a-212f comprises silicon nitride (SiN). Disposed on the sides of the gates 106a-106f and self-aligned caps 212a-212f are sets of left spacers 213a-213f and right spacers 214a-214f. The terms "left" and "right" are used here for convenience only in describing the embodiments depicted in FIGS. 2-10. In one embodiment, the left spacers 213a-f and the right spacers 214a-f each comprise SiOCN.

In addition, each left spacer 213a-f and each right spacer 214a-f may be referred to herein as an "inactive feature."

The self-aligned caps 212a-212f, the left spacers 213a-213f, and the right spacers 214a-214f may be formed using techniques known in the art.

Also disposed on and/or in the fins 104b, 104e are sources 220a, 220c and drains 220b, 220d. In one embodiment, the sources 220a, 220c and the drains 220b, 220d comprise epitaxial silicon, epitaxial silicon-germanium, doped epitaxial silicon, or doped epitaxial silicon-germanium. Each of the sources 220a, 220c and the drains 220b, 220d may be considered an "active feature," as the term is used herein. In addition, each gate 106a-106f may additionally be considered an "active feature."

Even though at least one spacer 213 or 214 lies between each source 220a, 220c or each drain 220b, 220d, on the one hand, and a gate 106a-f on the other, each of the sources and drains 220a-220d may be referred to as being "adjacent" to a gate, e.g. gate 106b or gate 106e.

Further, the semiconductor device 100 depicted in FIG. 2 comprises an interlayer dielectric (ILD) 230. The ILD 230 is disposed around each gate stack, e.g., laterally surrounding gate stack 106b, 212b, 213b, and 214b and above the self-aligned caps 212, left spacers 213, and right spacers 214, e.g., above the self-aligned cap 212b, the left spacer 213b, and the right spacer 214b. The ILD 230 may comprise any desired dielectric material, such as silicon oxide or tetraethylorthosilicate (TEOS), and may be formed by techniques known in the art.

Figure 3:
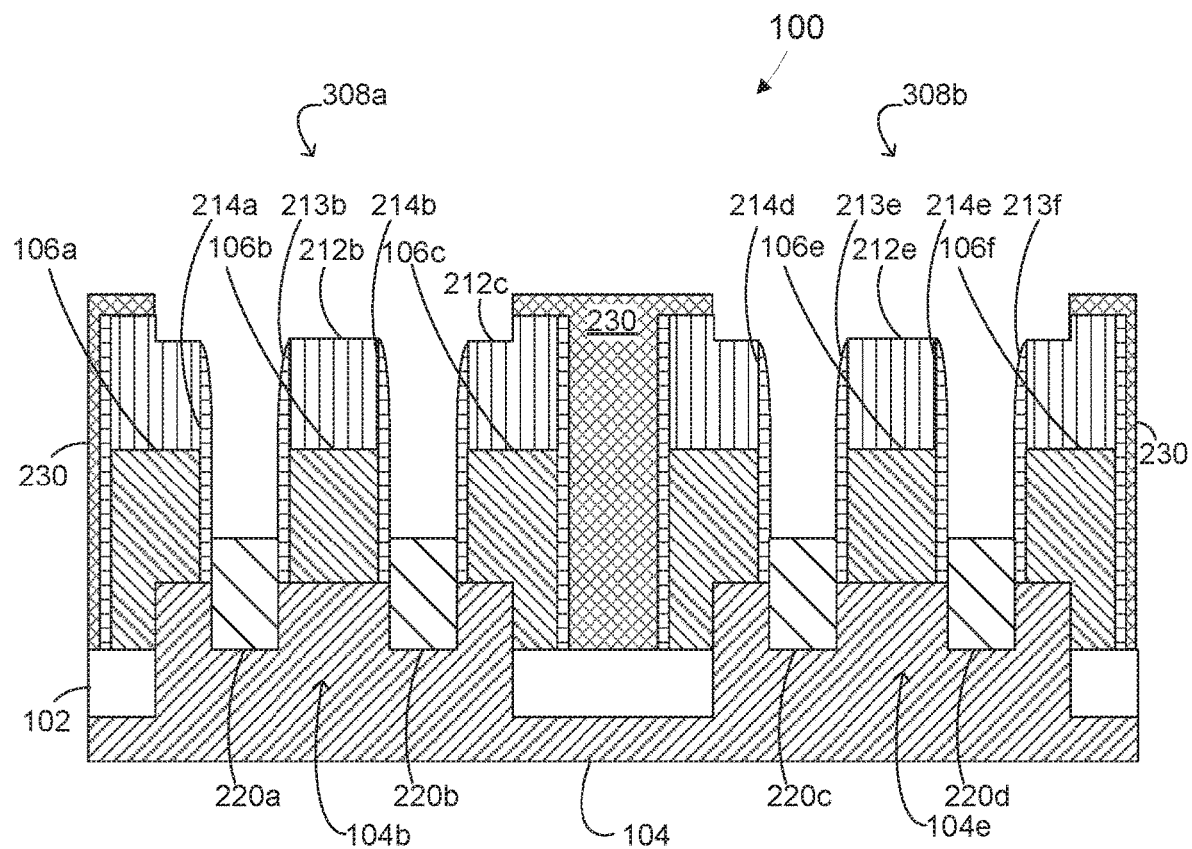
FIG. 3 illustrates a stylized X-cut cross-sectional depiction of a semiconductor device after a second stage of processing in accordance with embodiments herein.

FIG. 3 illustrates a stylized X-cut cross-sectional depiction of a semiconductor device after a second stage of processing in accordance with embodiments herein. In the second stage of processing, an organic polymerization layer (OPL) is deposited and patterned on the ILD 230, and a reactive ion etch (RIE) is performed to remove portions of the ILD 230 unprotected by the patterned OPL. The remaining OPL is then removed by ashing, such as with $O_2$ or $N_2H_2$ chemistry, in the RIE chamber. The RIE also removes portions of self-aligned caps 212a-212f, portions of left spacers 213b-213c and 213e-213f, and portions of right spacers 214a-214b and 214d-214e. As depicted, the RIE exposes the sources and drains 220a-220d and rounds off the upper portion of the exposed spacers 213b-213c, 213e-213f, 214a-214b, and 214d-214e. Desirably, erosion of the exposed spacers 213b-213c, 213e-213f, 214a-214b, and 214d-214e is minimized. Later processing stages performed in accordance with embodiments herein are robust to a variety of extents of self-aligned cap, left spacer, and right spacer partial removal.

The stage of processing depicted in FIG. 3 yields trenches 308a (above and around gate 106b) and 308b (above and around gate 106e).

Figure 4:
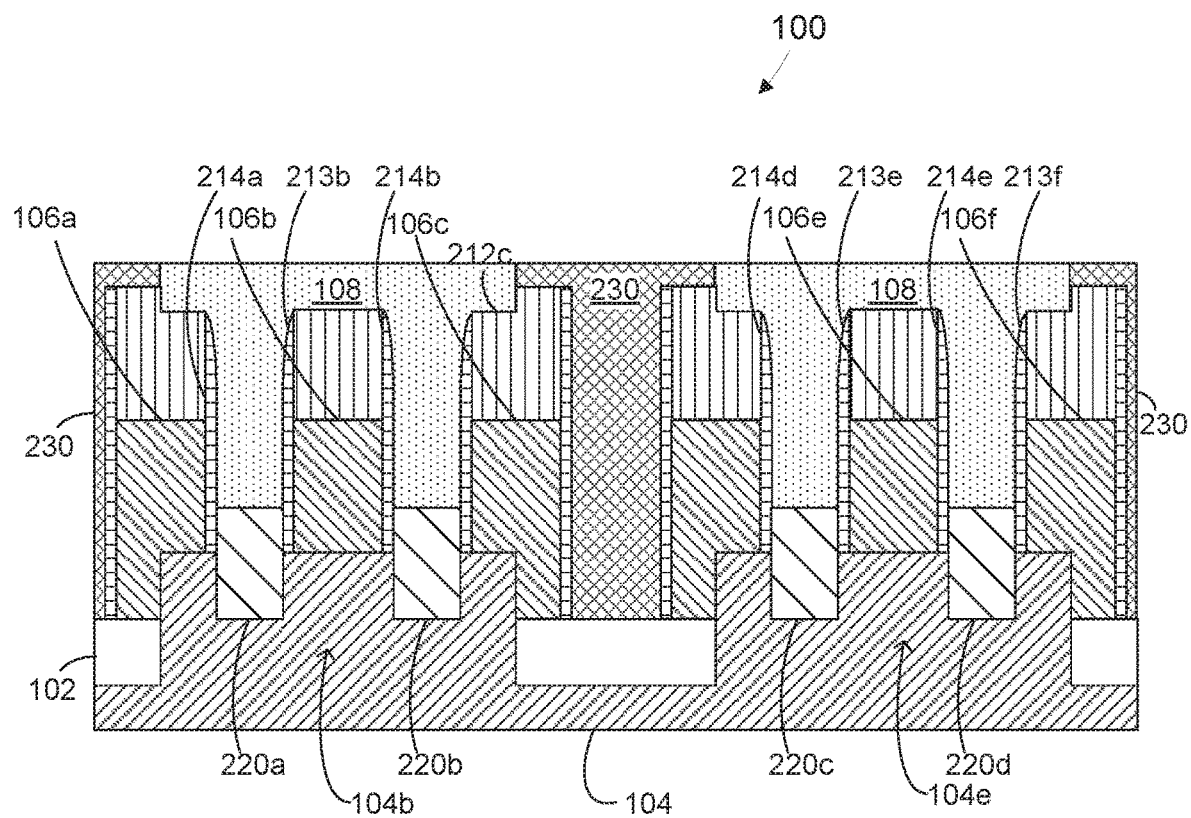
FIG. 4 illustrates a stylized X-cut cross-sectional depiction of a semiconductor device after a third stage of processing in accordance with embodiments herein.

FIG. 4 illustrates a stylized X-cut cross-sectional depiction of a semiconductor device after a third stage of processing in accordance with embodiments herein. In the third stage of processing, cobalt 108 is deposited to fill the trenches (308a and 308b, as shown in FIG. 3). Deposition of cobalt 108 may involve overfilling the trenches and the performance of chemical-mechanical polishing (CMP) to planarize the cobalt to the tops of the ILD 230. In one embodiment, deposition of cobalt 108 comprises first forming a titanium/titanium nitride liner (not shown) in the trenches, followed by filling the trenches with cobalt 108.

Figure 5:
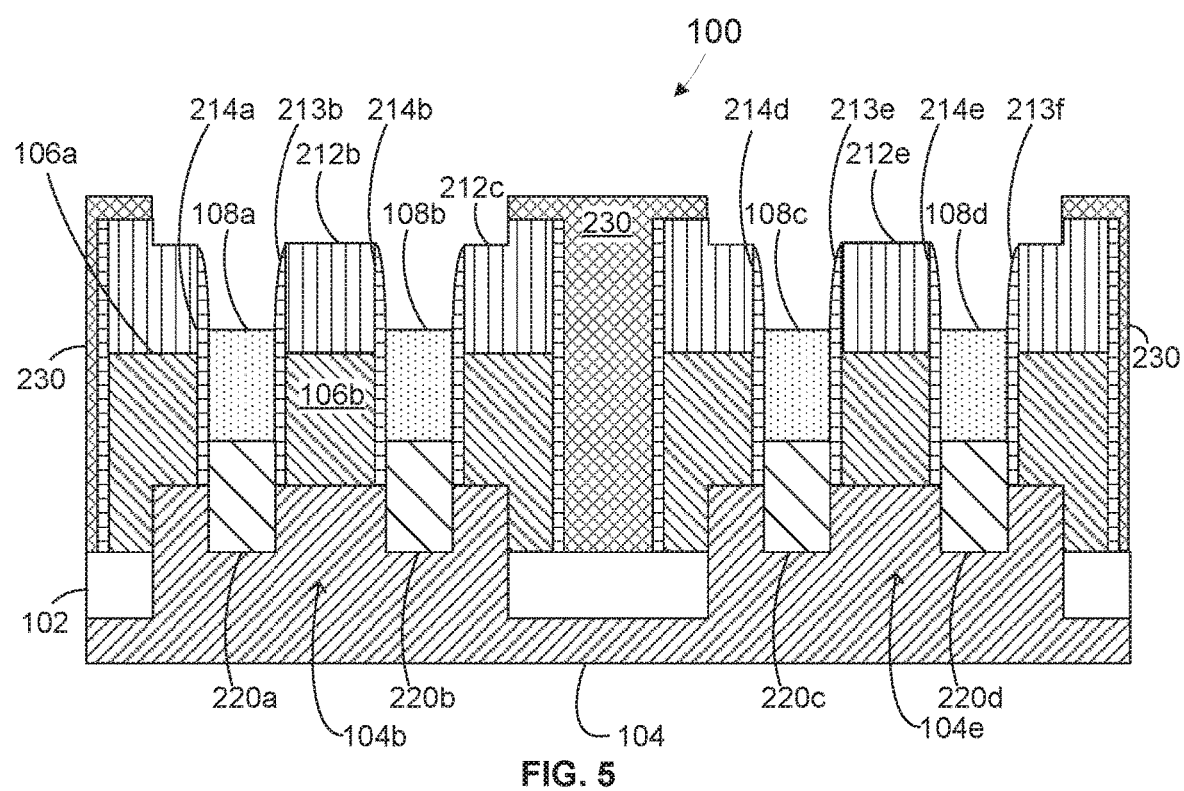
FIG. 5 illustrates a stylized X-cut cross-sectional depiction of a semiconductor device after a fourth stage of processing in accordance with embodiments herein.

FIG. 5 illustrates a stylized X-cut cross-sectional depiction of a semiconductor device after a fourth stage of processing in accordance with embodiments herein. In the fourth stage of processing, cobalt formations 108a, 108b, 108c, and 108d are formed. The cobalt formations 108a-108d may be formed by recessing the cobalt 108 using known techniques. Each of the cobalt formations 108a-108d is formed on an active feature of the semiconductor device 100, e.g., on source 220a, drain 220b, source 220c, or drain 220d.

After performing the fourth stage of processing and as depicted in FIG. 5, the semiconductor device 100 comprises an inactive feature (e.g., any of the left spacers 213b, 213c, 213e, or 213e, and any of the right spacers 214a, 214b, 214d, or 214e) above a cobalt formation (e.g., any of the cobalt formations 108a-108d). By "above a cobalt formation" is meant that at least a portion of the inactive feature is disposed above the top of the cobalt formation 108a-108d.

Figure 6:
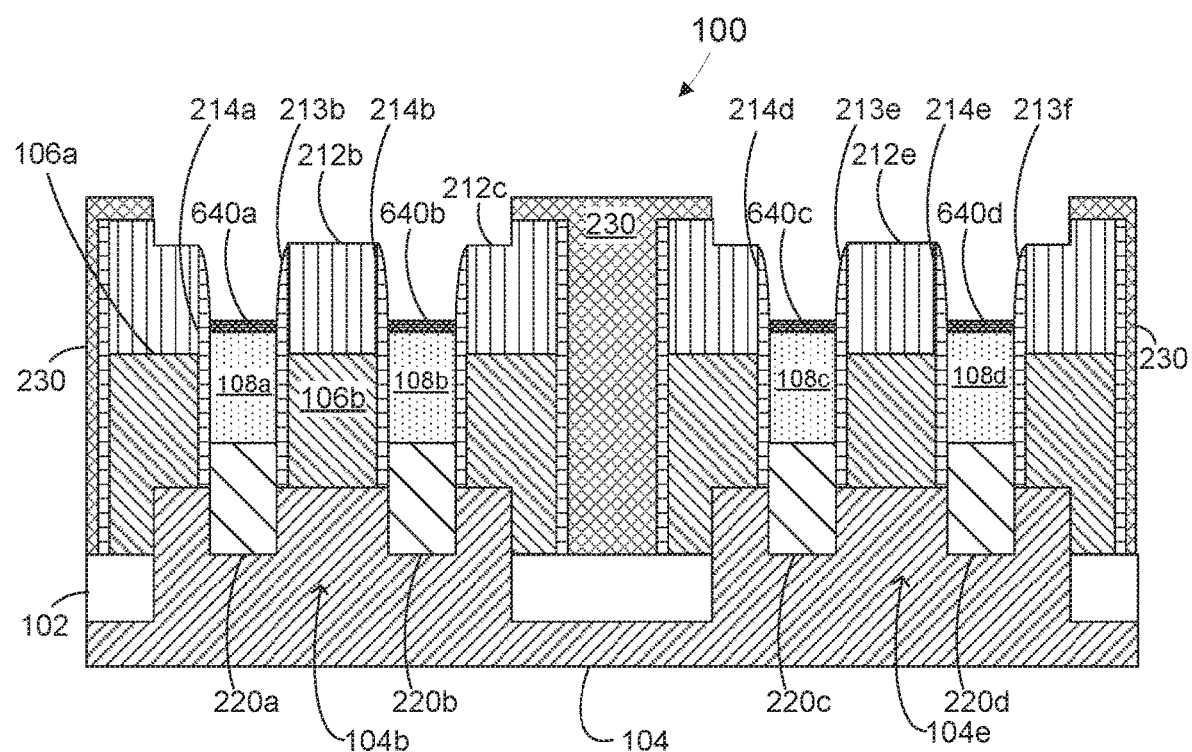
FIG. 6 illustrates a stylized X-cut cross-sectional depiction of a semiconductor device after a fifth stage of processing in accordance with embodiments herein.

FIG. 6 illustrates a stylized X-cut cross-sectional depiction of a semiconductor device after a fifth stage of processing in accordance with embodiments herein. In the fifth stage of processing, caps 640a-640d are formed on the cobalt formations 108a-108d. As can be seen, each cap 640a-640d is formed on one of the cobalt formations 108a-108d.

In one embodiment, each cap 640a-640d comprises a material selected from tungsten, ruthenium, titanium, silicon, or silicide. In a further embodiment, each cap 640a-640d comprises a material selected from tungsten or ruthenium. In a more particular embodiment, each cap 640a-640d comprises tungsten.

The caps 640a-640d may be formed by any selective formation process known to the person of ordinary skill in the art. In one embodiment, the caps 640a-640d may be formed by a process comprising wet cleaning the top surfaces of cobalt formations 108a-108d and subsequent selective deposition of e.g., tungsten.

In contrast to one prior art solution, the present method does not require the caps 640a-640d to comprise SiC to inhibit oxidation of cobalt formations 108a-108d.

Figure 7:
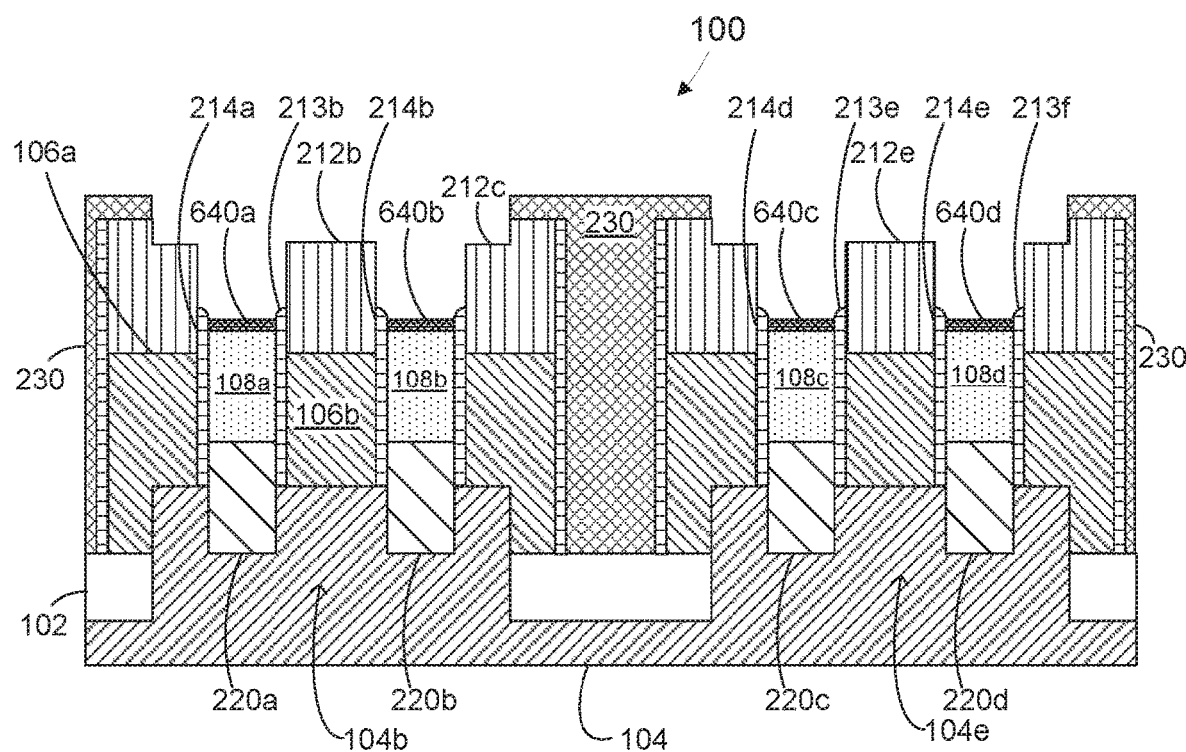
FIG. 7 illustrates a stylized X-cut cross-sectional depiction of a semiconductor device after a sixth stage of processing in accordance with embodiments herein.

FIG. 7 illustrates a stylized X-cut cross-sectional depiction of a semiconductor device after a sixth stage of processing in accordance with embodiments herein. In the sixth stage of processing, additional portions of inactive features (e.g., any of the left spacers 213b, 213c, 213e, or 213e, and any of the right spacers 214a, 214b, 214d, or 214e) are removed above the cobalt formations 108a-108d. The extents to which the additional portions of the inactive features are removed and the shapes, sizes, and dimensions of the retained portions of the inactive features above the cobalt formations 108a-108d (if any portion of the inactive features above the cobalt formations 108a-108d are retained) are not critical.

Removal of the portions of the inactive features may be performed by any known technique, such as RIE.

As depicted in FIG. 7, when removing at least a portion of the inactive features, each cobalt formation 108a-108d is substantially not removed. Though not to be bound by theory, each cap 640a-640d may protect each underlying cobalt formation 108a-108d from RIE or other spacer removal techniques.

Figure 8:
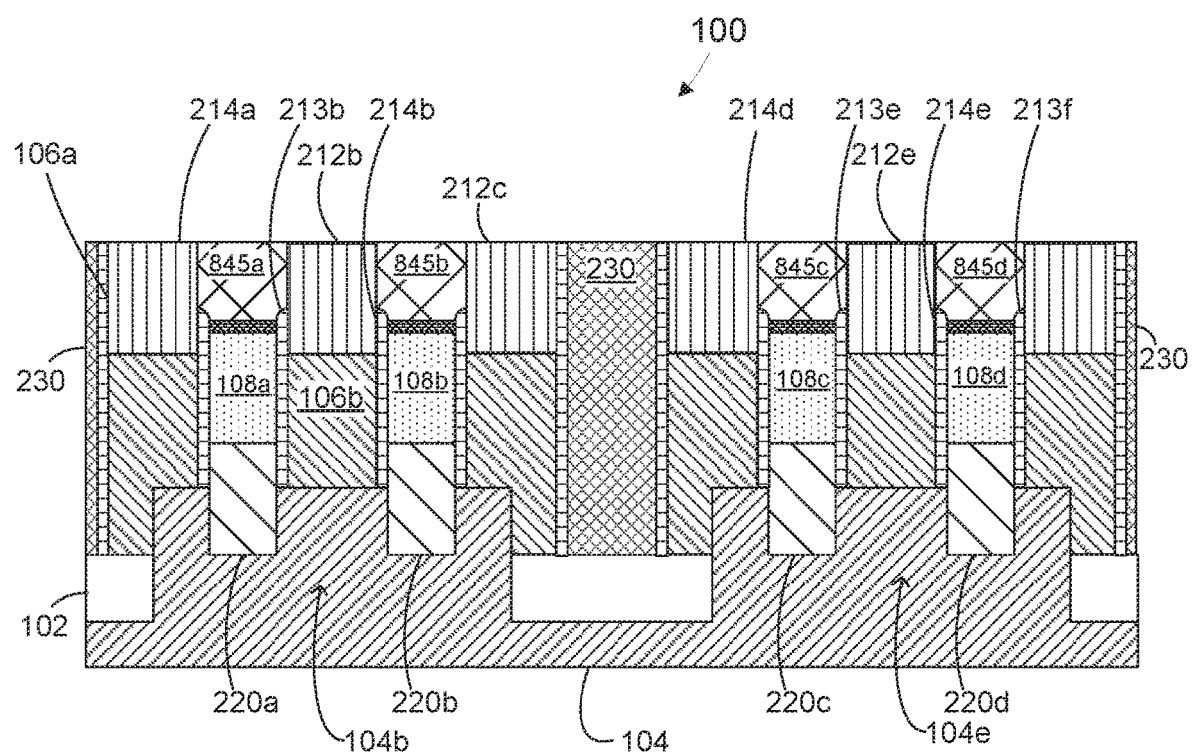
FIG. 8 illustrates a stylized X-cut cross-sectional depiction of a semiconductor device after a seventh stage of processing in accordance with embodiments herein.

FIG. 8 illustrates a stylized X-cut cross-sectional depiction of a semiconductor device after a seventh stage of processing in accordance with embodiments herein. In the seventh stage of processing, dielectric material (845a-845d) is planarized to the tops of self-aligned caps 212, and dielectric material (e.g., dielectric structures 845a-845d) is formed above the caps 640a-640d (as shown in FIG. 7) using known techniques.

In one embodiment, the dielectric material is selected from silicon oxide or silicon carbon oxide (SiOC). Though not to be bound by theory, each cap 640a-640d may protect each underlying cobalt formation 108a-108d from damage when forming dielectric structures 845a-845d from silicon oxide or SiOC.

Figure 9:
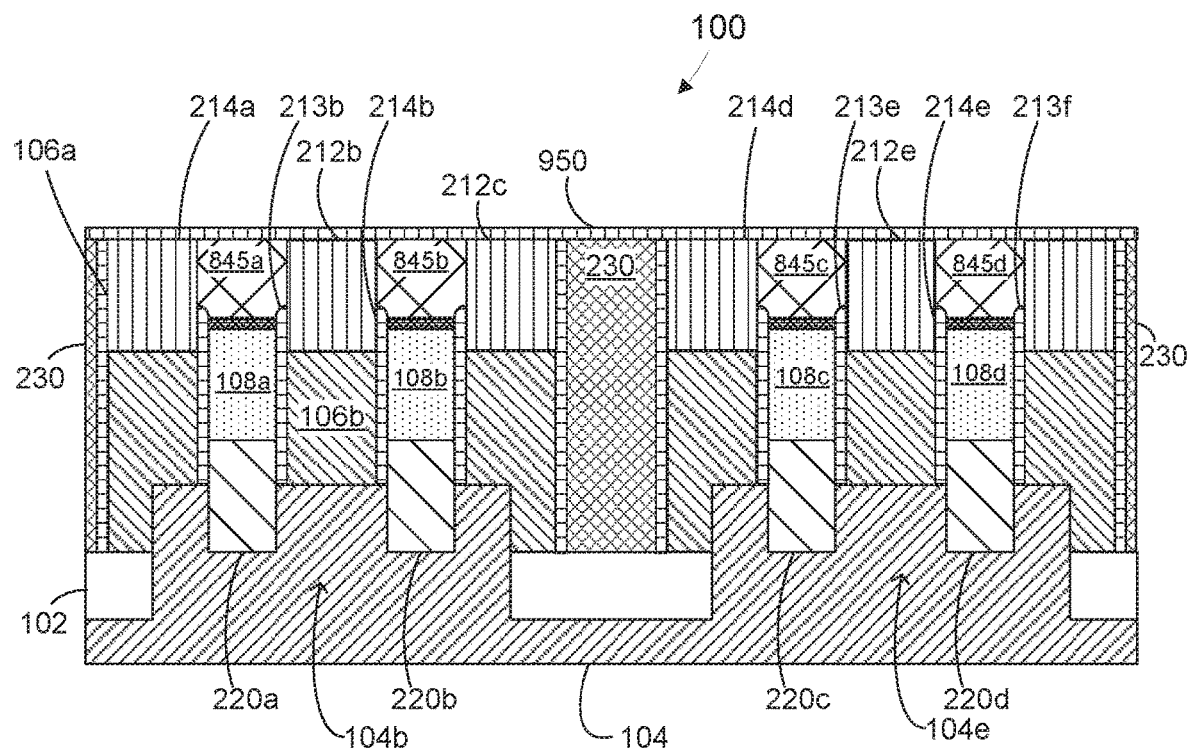
FIG. 9 illustrates a stylized X-cut cross-sectional depiction of a semiconductor device after an eighth stage of processing in accordance with embodiments herein.

FIG. 9 illustrates a stylized X-cut cross-sectional depiction of a semiconductor device after an eighth stage of processing in accordance with embodiments herein. In the depicted embodiment, an etch stop layer (ESL) 950 is deposited on the semiconductor device 100. The deposition of the ESL 950 may be desirable when the dielectric structures 845a-845d comprise silicon oxide, but may be optional when the dielectric structures 845a-845d comprise SiOC. The ESL 950 may comprise SiN, AlN/Al$_2$O$_3$, or other etch stop materials known to the person of ordinary skill in the art.

FIG. 10 illustrates a stylized X-cut cross-sectional depiction of a semiconductor device after a ninth stage of processing in accordance with embodiments herein. In the ninth stage of processing, an ILD 1055 is deposited and patterned over the semiconductor device 100. A first contact 110a is formed to a cobalt formation, e.g., cobalt formation 108c. Forming the first contact 110a may involve removal of the portion of the ESL 950 (if present) exposed by the patterned mask 1055, followed by removal of a portion of the dielectric material, e.g., the dielectric structure 845c, and deposition of a contact metal to form the first contact 110a. In one embodiment, the first contact 110a comprises tungsten, copper, ruthenium, molybdenum, or cobalt.

In one embodiment, as depicted in FIG. 10, a second contact 110b is formed to one of the plurality of gates 106a-106f, e.g., to gate 106b. The second contact 110b may be formed by the same technique and from the same contact metal as the first contact 110a.

In contrast to a prior art solution, in which gate contacts are only formed in STI regions, the present method allows formation of a gate contact (e.g., second contact 110b) over a fin (e.g., fin 104b).

Although FIGS. 1-10 have depicted and referred to specific numbers of fins, gates, cobalt formations, first contacts, second contacts, etc., the number of each structure may be varied as a routine matter by the person of ordinary skill in the art. In addition, the location of the first contact 110a and the second contact 110b in the same X-cut is presented solely for convenience. One or more first contacts 110a and one or more second contacts 110b may be disposed in a staggered arrangement.

In subsequent processing stages (not shown), the ESL 950 may be removed, the first contact 110a and the second contact 110b may be planarized, and additional layers of the semiconductor device 100 may be formed.

Figure 11:
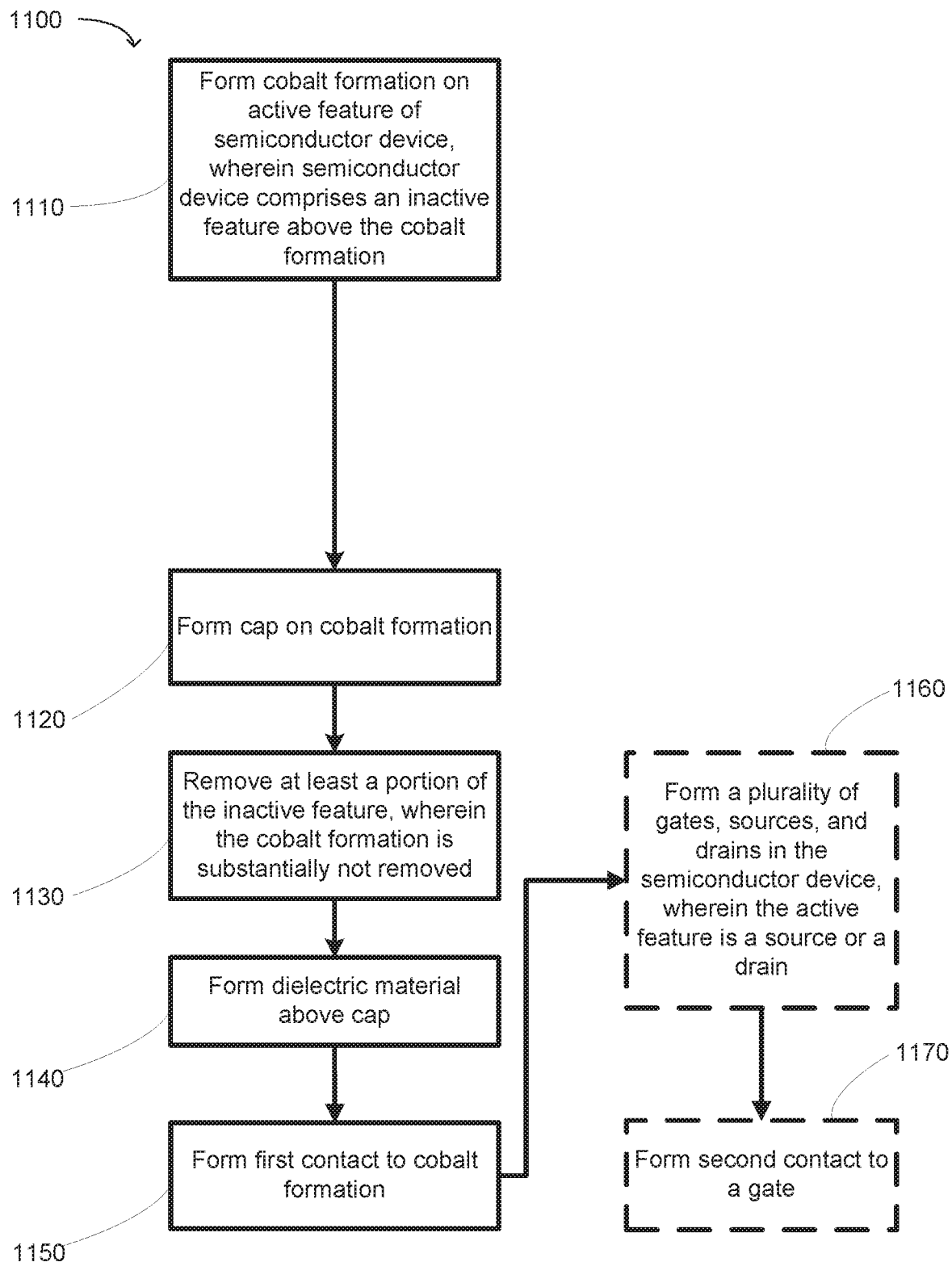
FIG. 11 illustrates a flowchart of a method, in accordance with embodiments herein.

FIG. 11 presents a flowchart of a method 1100 in accordance with embodiments herein. The method 1100 comprises forming (at 1110) a cobalt formation on an active feature of a semiconductor device, wherein the semiconductor device comprises an inactive feature above the cobalt formation. The method 1100 also comprises forming (at 1120) a cap on the cobalt formation. In one embodiment, forming (at 1120) comprises forming the cap from a material selected from tungsten, ruthenium, titanium, silicon, or silicide. In a further embodiment, forming (at 1120) comprises forming the cap from a material selected from tungsten or ruthenium. In a particular embodiment, forming (at 1120) comprises forming the cap from tungsten.

The method 1100 additionally comprises removing (at 1130) at least a portion of the inactive feature, wherein the cobalt formation is substantially not removed. The method 1100 further comprises forming (at 1140) a dielectric material above the cap. In one embodiment, forming (at 1140) comprises forming the dielectric material from silicon oxide or silicon carbon oxide (SiOC).

The method 1100 still further comprises forming (at 1150) a first contact to the cobalt formation. In one embodiment, forming (at 1150) comprises forming the first contact from tungsten, ruthenium, molybdenum, copper, aluminum, or cobalt.

In one embodiment, the method 1100 further comprises forming (at 1160) a plurality of gates, a plurality of sources, and a plurality of drains in the semiconductor device, wherein each source is adjacent to one of the plurality of gates and each drain is adjacent to one of the plurality of gates, wherein the active feature is one of the plurality of sources or one of the plurality of drains. In this embodiment, the method 1100 may also further comprise forming (at 1170) a second contact to one of the plurality of gates.

Figure 12:
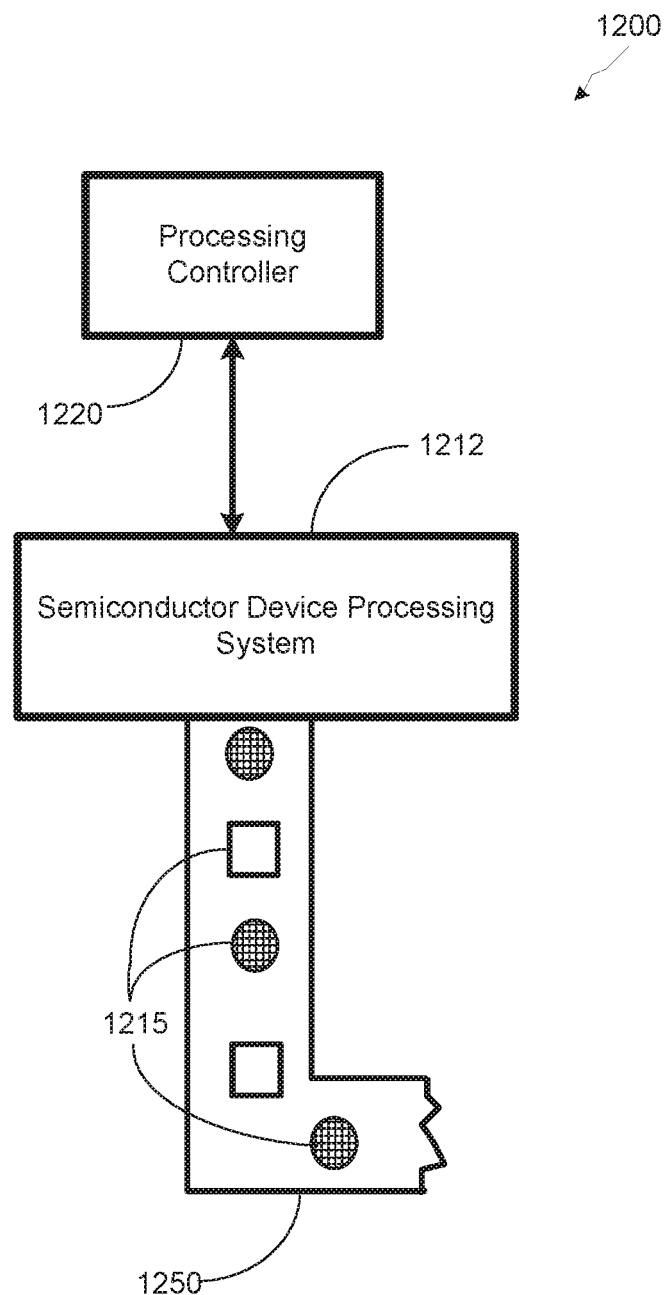
FIG. 12 illustrates a stylized depiction of a system for fabricating a semiconductor device, in accordance with embodiments herein.

Turning now to FIG. 12, a stylized depiction of a system for fabricating a semiconductor device comprising a cobalt formation as described above. The system 1200 is capable of manufacturing semiconductor devices using the process steps described above.

The semiconductor device processing system 1212 may comprise various processing stations, such as etch process stations, photolithography process stations, CMP process stations, etc. One or more of the processing steps performed by the processing system 1212 may be controlled by the processing controller 1220. The processing controller 1220 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1212 may produce integrated circuits on a medium, such as silicon wafers 1215. The processing system 1212 may provide processed silicon wafers 1215 on a transport mechanism 1250, such as a conveyor system. In some embodiments, the conveyor system may be sophisticated clean room transport systems that are capable of transporting semiconductor wafers. In one embodiment, the semiconductor device processing system 1212 may perform one or more processing steps, e.g., one or more of those described above and depicted in FIG. 11.

In some embodiments, the items labeled "1215" may represent individual wafers, and in other embodiments, the items 1215 may represent a group of semiconductor wafers, e.g., a "lot" of semiconductor wafers. Each wafer 1215 may comprise a transistor, a capacitor, a resistor, a memory cell, a processor, and/or the like. In one embodiment, the wafer 1215 includes a plurality of transistors.

The system 1200 may be capable of performing analysis and manufacturing of various products involving various technologies. For example, the system 1200 may use design and production data for manufacturing devices of CMOS technology, Flash technology, BiCMOS technology, power devices, memory devices (e.g., DRAM devices), NAND memory devices, and/or various other semiconductor technologies.

The semiconductor device processing system 1212 may be adapted to perform one or more of the following:

form a cobalt formation on an active feature of a semiconductor device, wherein the semiconductor device comprises an inactive feature above the cobalt formation;

form a cap on the cobalt formation;

remove at least a portion of the inactive feature, wherein the cobalt formation is substantially not removed;

form a dielectric material above the cap; and form a first contact to the cobalt formation.

In one embodiment, the semiconductor device processing system is adapted to form the cap from a material selected from tungsten, ruthenium, titanium, silicon, or silicide. In a further embodiment, the semiconductor device processing system is adapted to form the cap from tungsten or ruthenium. In a particular embodiment, the semiconductor device processing system is adapted to form the cap from tungsten.

In one embodiment, the semiconductor device processing system is adapted to form the dielectric material from silicon oxide or silicon carbon oxide (SiOC).

In one embodiment, the semiconductor device processing system is further adapted to perform one or more of the following:

form a plurality of gates, a plurality of sources, and a plurality of drains in the semiconductor device, wherein each source is adjacent to one of the plurality of gates and each drain is adjacent to one of the plurality of gates; wherein the active feature is one of the plurality of sources or one of the plurality of drains, and form a second contact to one of the plurality of gates.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid-state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the disclosure may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the disclosure. Accordingly, the protection sought herein is as set forth in the claims below.

What is claimed is:

1. A method, comprising:
   forming a cobalt formation on an active feature of a semiconductor device, wherein the semiconductor device comprises an inactive feature above the cobalt formation;
   forming a cap on the cobalt formation;
   removing at least a portion of the inactive feature after forming the cobalt formation and forming the cap, wherein the cobalt formation is substantially not removed while removing the at least the portion of the inactive feature;
   forming a dielectric material above the cap; and
   forming a first contact to the cobalt formation.

2. The method of claim 1, wherein the cap comprises a material selected from tungsten, ruthenium, titanium, silicon, or silicide.

3. The method of claim 2, wherein the cap comprises a material selected from tungsten or ruthenium.

4. The method of claim 3, wherein the cap comprises tungsten.

5. The method of claim 1, wherein the dielectric material is selected from silicon oxide or silicon carbon oxide (SiOC).

6. The method of claim 1, wherein the first contact comprises tungsten, copper, aluminum, ruthenium, molybdenum, or cobalt.

7. The method of claim 1, further comprising:
   forming a plurality of gates, a plurality of sources, and a plurality of drains in the semiconductor device, wherein each source is adjacent to one of the plurality of gates and each drain is adjacent to one of the plurality of gates;
   wherein the active feature is one of the plurality of sources or one of the plurality of drains, and the method further comprises:
   forming a second contact to one of the plurality of gates.

8. A system, comprising:
   a semiconductor device processing system to manufacture a semiconductor device; and
   a processing controller operatively coupled to said semiconductor device processing system, said processing controller configured to control an operation of the semiconductor device processing system;
   wherein the semiconductor device processing system is adapted to:
   form a cobalt formation on an active feature of a semiconductor device, wherein the semiconductor device comprises an inactive feature above the cobalt formation;
   form a cap on the cobalt formation;
   remove at least a portion of the inactive feature after forming the cobalt formation and forming the cap, wherein the cobalt formation is substantially not removed while removing the at least the portion of the inactive feature;

form a dielectric material above the cap; and form a first contact to the cobalt formation.

9. The system of claim 8, wherein the semiconductor device processing system is adapted to form the cap from a material selected from tungsten, ruthenium, titanium, silicon, or silicide.

10. The system of claim 9, wherein the semiconductor device processing system is adapted to form the cap from tungsten or ruthenium.

11. The system of claim 10, wherein the semiconductor device processing system is adapted to form the cap from tungsten.

12. The system of claim 8, wherein the semiconductor device processing system is adapted to form the dielectric material from silicon oxide or silicon carbon oxide (SiOC).

13. The system of claim 8, wherein the semiconductor device processing system is adapted to form a plurality of gates, a plurality of sources, and a plurality of drains in the semiconductor device, wherein each source is adjacent to one of the plurality of gates and each drain is adjacent to one of the plurality of gates;

wherein the active feature is one of the plurality of sources or one of the plurality of drains, and the semiconductor device processing system is further adapted to form a second contact to one of the plurality of gates.

* * * * *